(12) United States Patent
Gonzalez et al.

(10) Patent No.: US 6,746,907 B2
(45) Date of Patent: *Jun. 8, 2004

(54) METHODS OF FORMING FIELD EFFECT TRANSISTORS AND FIELD EFFECT TRANSISTOR CIRCUITRY

(75) Inventors: Fernando Gonzalez, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/844,819

(22) Filed: Apr. 27, 2001

(65) Prior Publication Data

US 2001/0016378 A1 Aug. 23, 2001

Related U.S. Application Data

(63) Continuation of application No. 09/032,267, filed on Feb. 27, 1998, now Pat. No. 6,271,067.

(51) Int. Cl.$^7$ ................. H01L 21/8238; H01L 21/8234
(52) U.S. Cl. ................ 438/200; 438/237; 438/238; 438/563; 438/586
(58) Field of Search ................ 438/200, 237, 438/238, 275, 532, 586, FOR 214, FOR 220, 558, 563

(56) References Cited

U.S. PATENT DOCUMENTS

| | | | |
|---|---|---|---|
| 3,577,019 A | 5/1971 | Storm | 323/110 |
| 4,246,502 A | 1/1981 | Kubinec | 257/355 |
| 4,297,721 A | 10/1981 | McKenny et al. | 438/238 |
| 4,546,401 A | 10/1985 | Svedberg | |
| 5,250,457 A | 10/1993 | Dennison | 257/296 |
| 5,268,323 A | 12/1993 | Fischer et al. | 438/200 |
| 5,317,282 A | 5/1994 | Quast | 330/277 |
| 5,629,536 A | 5/1997 | Heminger et al. | 257/173 |
| 5,631,187 A | 5/1997 | Phipps et al. | 438/237 |
| 5,661,329 A | 8/1997 | Hiramoto et al. | 257/510 |
| 5,681,778 A | 10/1997 | Manning | 438/238 |
| 5,734,175 A | 3/1998 | Taniguchi | 257/48 |
| 5,744,842 A | 4/1998 | Ker | 257/362 |
| 5,847,597 A | 12/1998 | Ooishi et al. | 327/543 |
| 6,107,664 A | 8/2000 | Quoirin et al. | 257/355 |
| 6,114,197 A | 9/2000 | Hsu | 438/199 |
| 6,121,665 A | 9/2000 | Gonzalez et al. | 257/402 |
| 6,271,067 B1 * | 8/2001 | Gonzalez et al. | 438/200 |

OTHER PUBLICATIONS

Physics of Semiconductor Devices; S.M. Sze; pp. 505–512; © 1969.
Solid State Electronic Devices; Ben G. Streetman; pp. 298–300; © 1972.
"The New IEEE Standard Dictionary of Electrical and Electronics Terms—Fifth Edition," ©1993, p. 1467 (3 pages total).

* cited by examiner

Primary Examiner—Michael Trinh
(74) Attorney, Agent, or Firm—Wells St. John P.S.

(57) ABSTRACT

Methods of forming field effect transistors and resultant field effect transistor circuitry are described. In one embodiment, a semiconductive substrate includes a field effect transistor having a body. A first resistive element is received by the substrate and connected between the transistor's gate and the body. A second resistive element is received by the substrate and connected between the body and a reference voltage node. The first and second resistive elements form a voltage divider which is configured to selectively change threshold voltages of the field effect transistor with state changes in the gate voltage. In a preferred embodiment, first and second diode assemblies are positioned over the substrate and connected between the gate and body, and the body and a reference voltage node to provide the voltage divider.

44 Claims, 9 Drawing Sheets

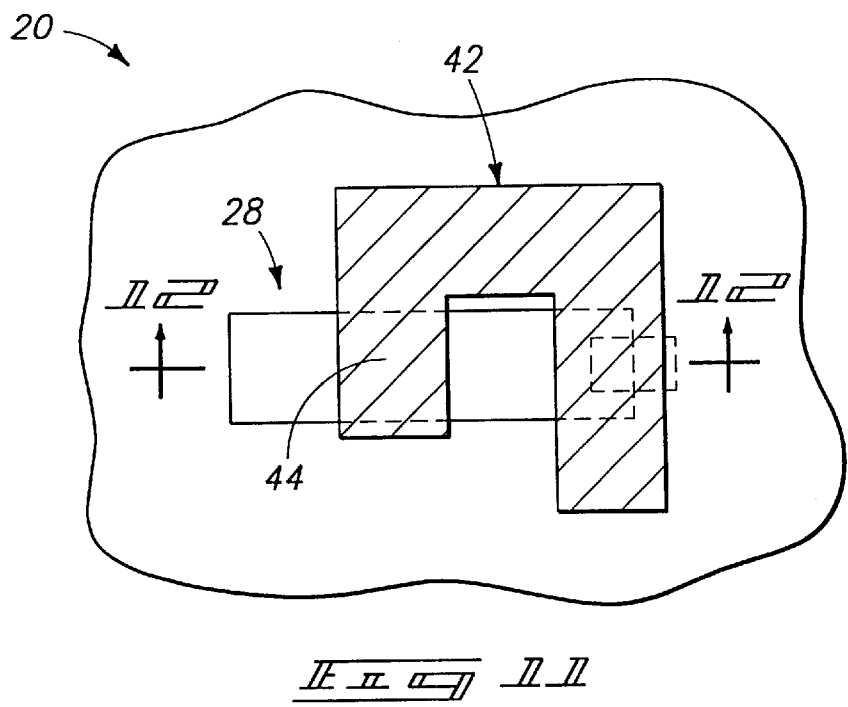
_FIG_ 11
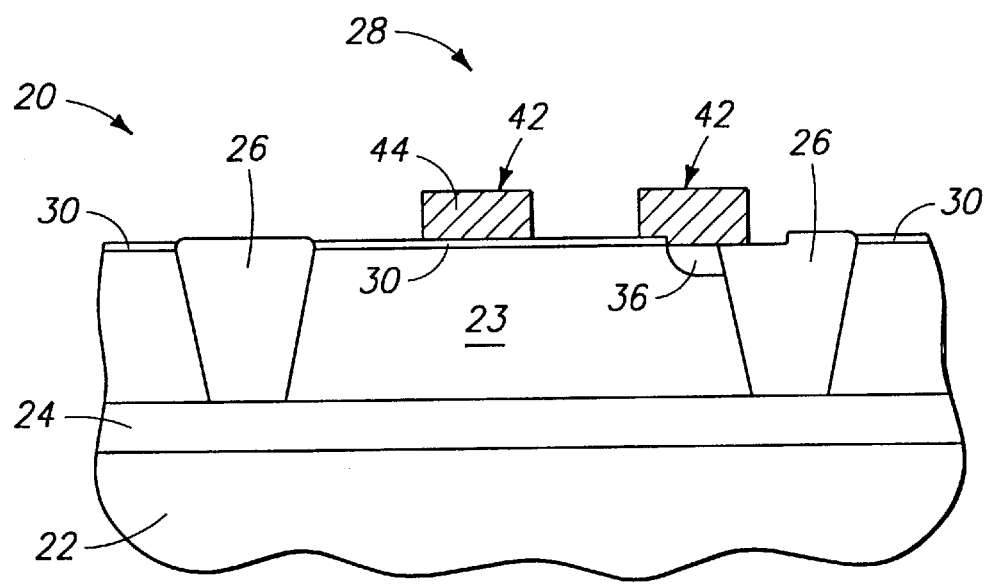
_FIG_ 12

METHODS OF FORMING FIELD EFFECT TRANSISTORS AND FIELD EFFECT TRANSISTOR CIRCUITRY

CROSS REFERENCE TO RELATED APPLICATION

This patent application is a Continuation Application of U.S. patent application Ser. No. 09/032,267, filed on Feb. 27, 1998, entitled "Methods of Forming Field Effect Transistors and Field Effect Transistor Circuitry" and naming Fernando Gonzalez and Chandra Mouli as inventors, now U.S. Pat. No. 6,271,067 B1, the disclosure of which is incorporated by reference.

TECHNICAL FIELD

This invention relates to methods of forming field effect transistors, and to field effect transistor circuitry.

BACKGROUND OF THE INVENTION

It is desirable in transistors to be able to drive high currents. Driving high currents can enhance a transistor's operating performance including its operating speed. In field effect transistors (FETs), current flow is primarily conducted by way of the drain-to-source current $I_{ds}$. While higher drive currents can be achieved by building wider FET devices, tradeoffs are made in valuable wafer real estate. Larger devices also typically have larger capacitances which can adversely impact device performance. Also typically, a high $I_{ds}$ current in FET devices can result in an increased sub-threshold current leakage. It is desirable in FETs to minimize the sub-threshold current leakage. Accordingly, it is desirable to have the $I_{ds}$ ratio of on-state current ($I_{on}$) to off-state current ($I_{off}$) be as high as possible. Such improves sub-threshold device leakage characteristics as well as increases the transistor's operating speed performance.

This invention arose out of concerns associated with improving field effect transistor performance.

SUMMARY OF THE INVENTION

Methods of forming field effect transistors and resultant field effect transistor circuitry are described. In one embodiment, a semiconductive substrate includes a field effect transistor having a body. A first resistive element is received by the substrate and connected between the transistor's gate and the body. A second resistive element is received by the substrate and connected between the body and a reference voltage node. The first and second resistive elements form a voltage divider which is configured to selectively change threshold voltages of the field effect transistor with state changes in the gate voltage. In a preferred embodiment, first and second diode assemblies are positioned over the substrate and connected between the gate and body, and the body and a reference voltage node to provide the voltage divider.

BRIEF DESCRIPTION OF THE DRAWINGS

Preferred embodiments of the invention are described below with reference to the following accompanying drawings.

FIG. 12 is a view which is taken along line 12—12 in FIG. 11.

FIG. 17 is a schematic diagram of field effect transistor circuitry constructed in accordance with a preferred embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
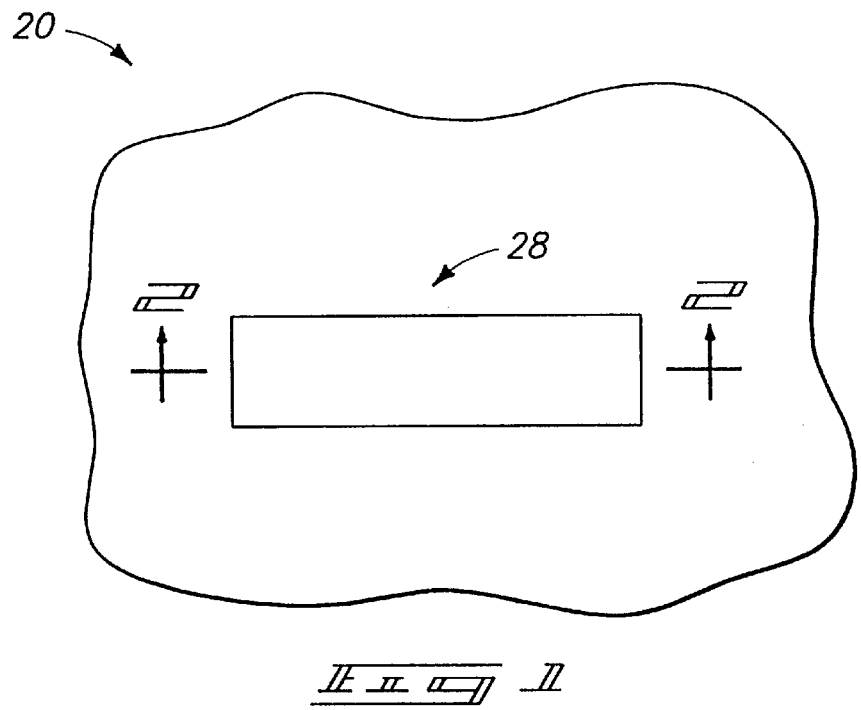
FIG. 1 is a top plan view of a semiconductor wafer fragment in process in accordance with one embodiment of the invention.
Figure 2:
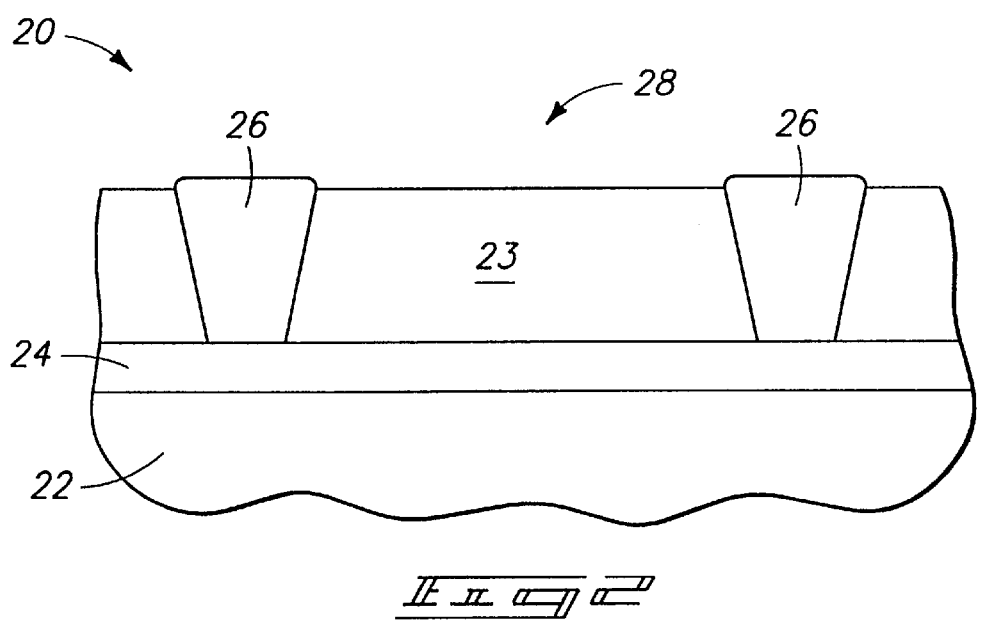
FIG. 2 is a diagrammatic side sectional view of the FIG. 1 wafer fragment taken along line 2—2 in FIG. 1.

Referring to FIGS. 1 and 2, a semiconductor wafer fragment 20 includes a semiconductive substrate 22 having a substrate region 23. Region 23 comprises a body of a field effect transistor which is to be formed. In the illustrated example, substrate 22 includes a buried mega eV (MeV) layer 24 and a pair of isolation regions 26 which collectively isolate the body. Where n-channel devices are to be formed, substrate region 23 comprises p-type material and layer 24 comprises n-type material. Where p-channel devices are to be formed, substrate region 23 comprises n-type material and layer 24 comprises p-type material. Layer 24 and isolation regions 26 define an area 28 over or within which field effect transistor circuitry is to be formed. The substrate can comprise any suitable substrate. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The substrate can also comprise silicon-on-insulator substrates formed through various known techniques.

Figure 3:
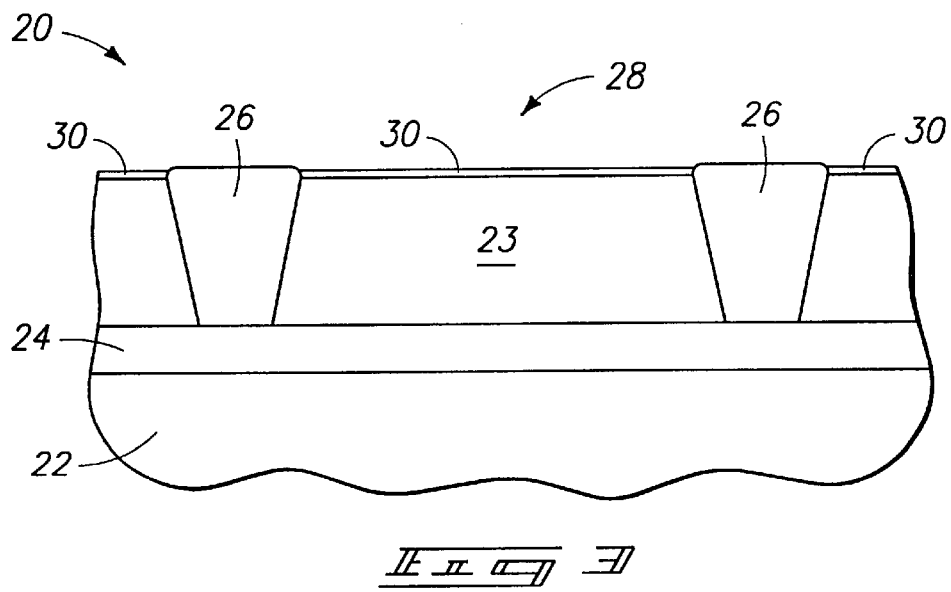
FIG. 3 is a view of the FIG. 2 wafer fragment at a processing step subsequent to that shown in FIG. 2.

Referring to FIG. 3, a gate oxide layer 30 is formed over substrate 22.

Figure 4:
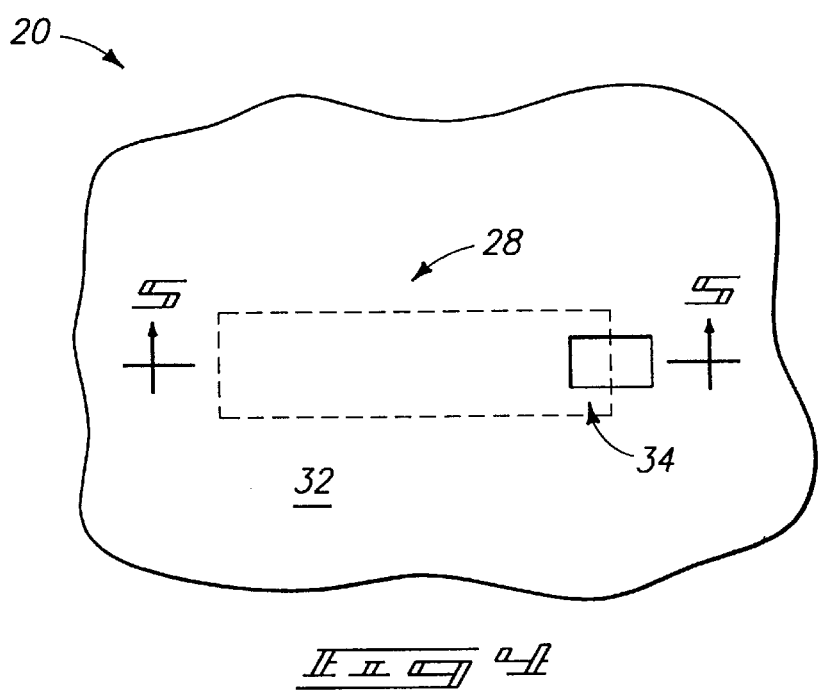
FIG. 4 is a top plan view of the FIG. 1 wafer fragment at a processing step subsequent to that shown in FIG. 1.
Figure 5:
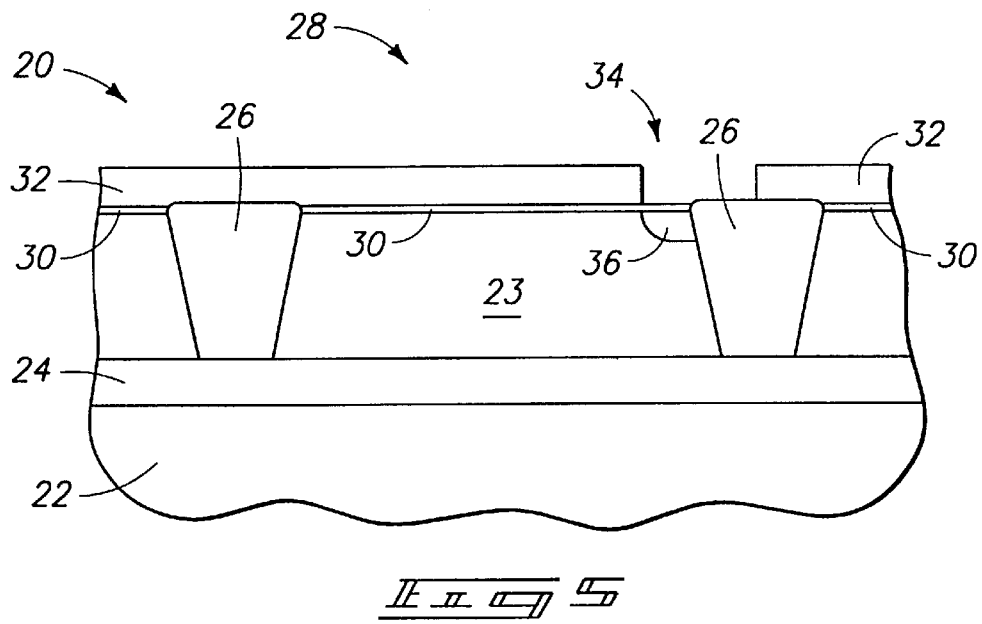
FIG. 5 is a view which is taken along line 5—5 in FIG. 4.

Referring to FIGS. 4 and 5, a first patterned masking layer 32 is formed over substrate 22 and defines an opening 34 over area 28. Layer 32 can comprise photoresist. Dopant is introduced into the substrate through opening 34 to form a buried contact diffusion region 36. In the illustrated example, layer 24 comprises an n-type material, substrate region 23 comprises a p-type material, and buried contact diffusion region 36 comprises a p+ diffusion region. A wet oxide etch can be conducted either prior to or subsequent to formation of diffusion region 36 to remove portions of oxide layer 30 from over the substrate area where dopant is to be introduced.

Figure 6:
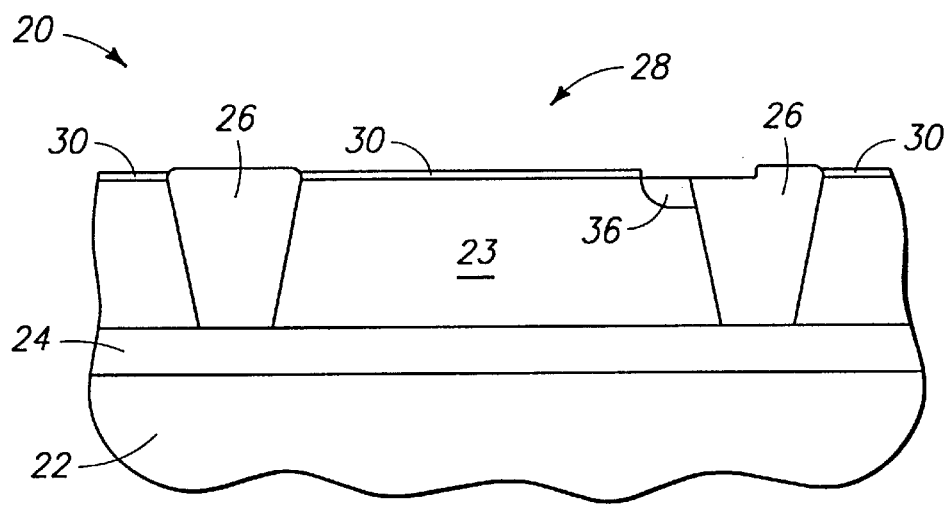
FIG. 6 is a view of the FIG. 5 wafer fragment at a processing step subsequent to that shown in FIG. 5.

Referring to FIG. 6, first patterned masking layer 32 is removed.

Figure 7:
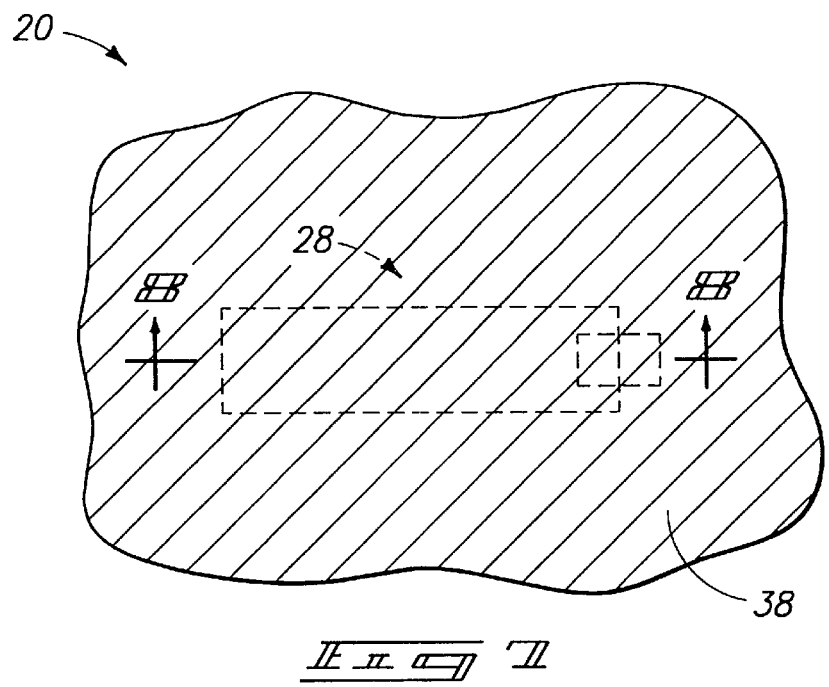
FIG. 7 is a top plan view of the FIG. 4 wafer fragment at a processing step subsequent to that shown in FIG. 4.
Figure 8:
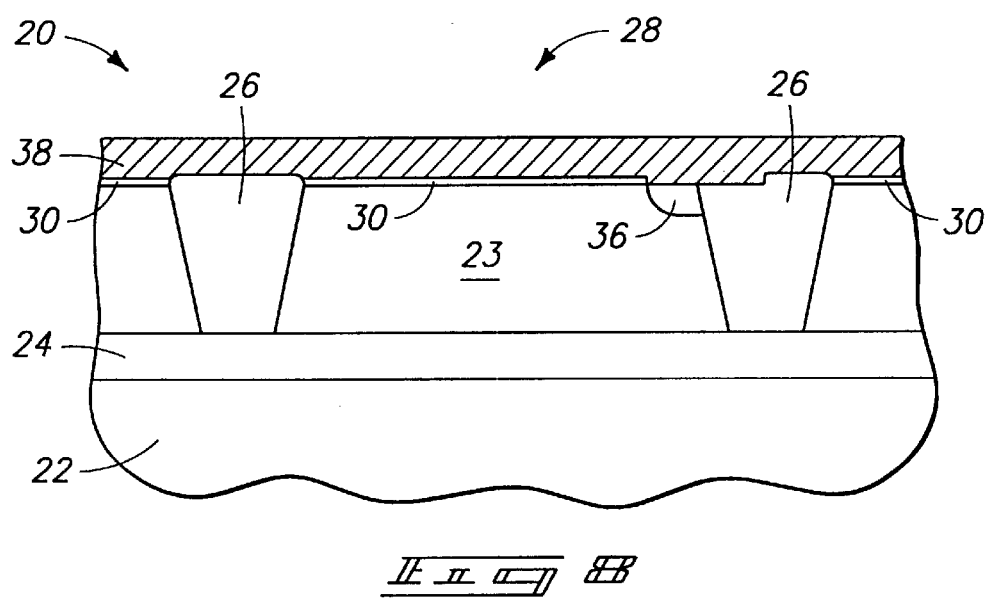
FIG. 8 is a view of the FIG. 7 wafer fragment taken along line 8—8 in FIG. 7.

Referring to FIGS. 7 and 8, a conductive material layer 38 is formed over substrate 22 and in electrical communication with buried contact diffusion region 36. In a preferred embodiment, layer 38 is in physical contact with diffusion region 36. An exemplary material is in situ n-type doped polysilicon.

Figure 9:
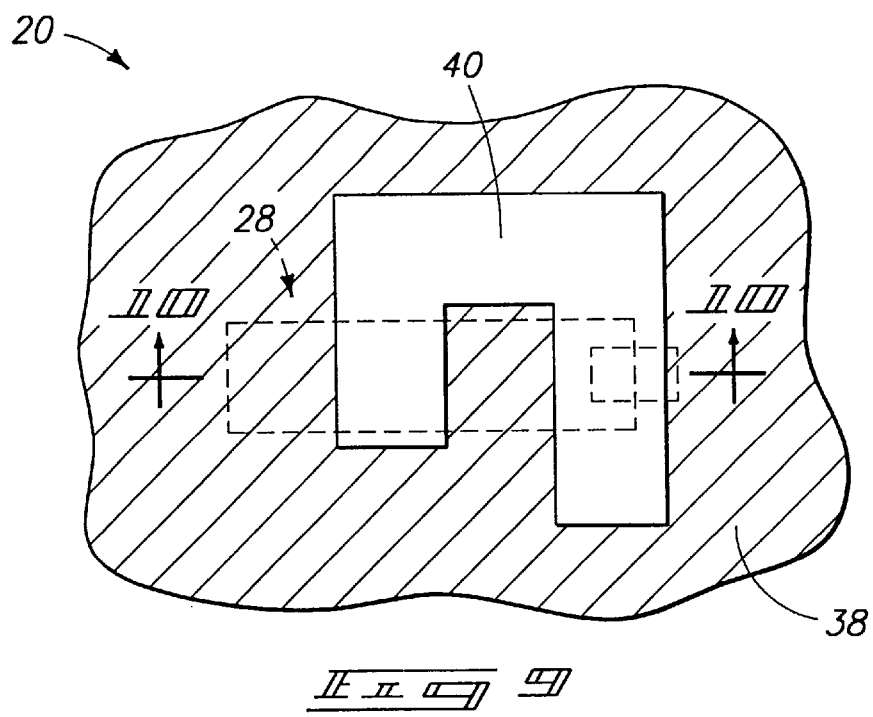
FIG. 9 is a view of the FIG. 7 wafer fragment at a processing step subsequent to that shown in FIG. 7.
Figure 10:
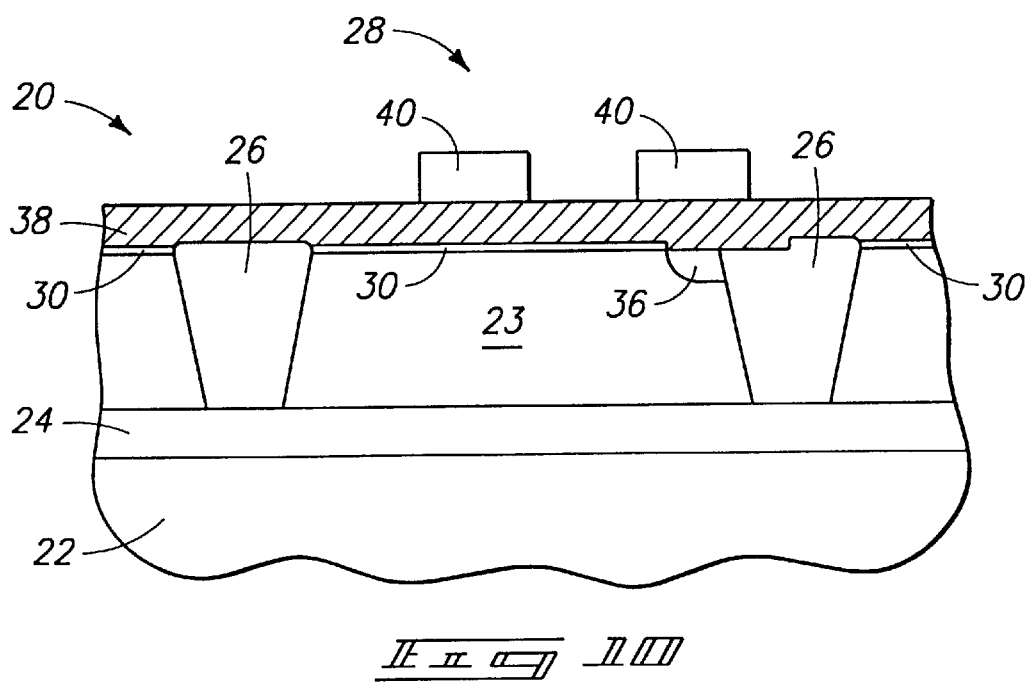
FIG. 10 is a view of the FIG. 9 wafer fragment taken along line 10—10 in FIG. 9.

Referring to FIGS. 9 and 10, a patterned masking layer 40 is formed over substrate 22 and defines a conductive line pattern. Layer 40 can comprise photoresist.

Figure 11:
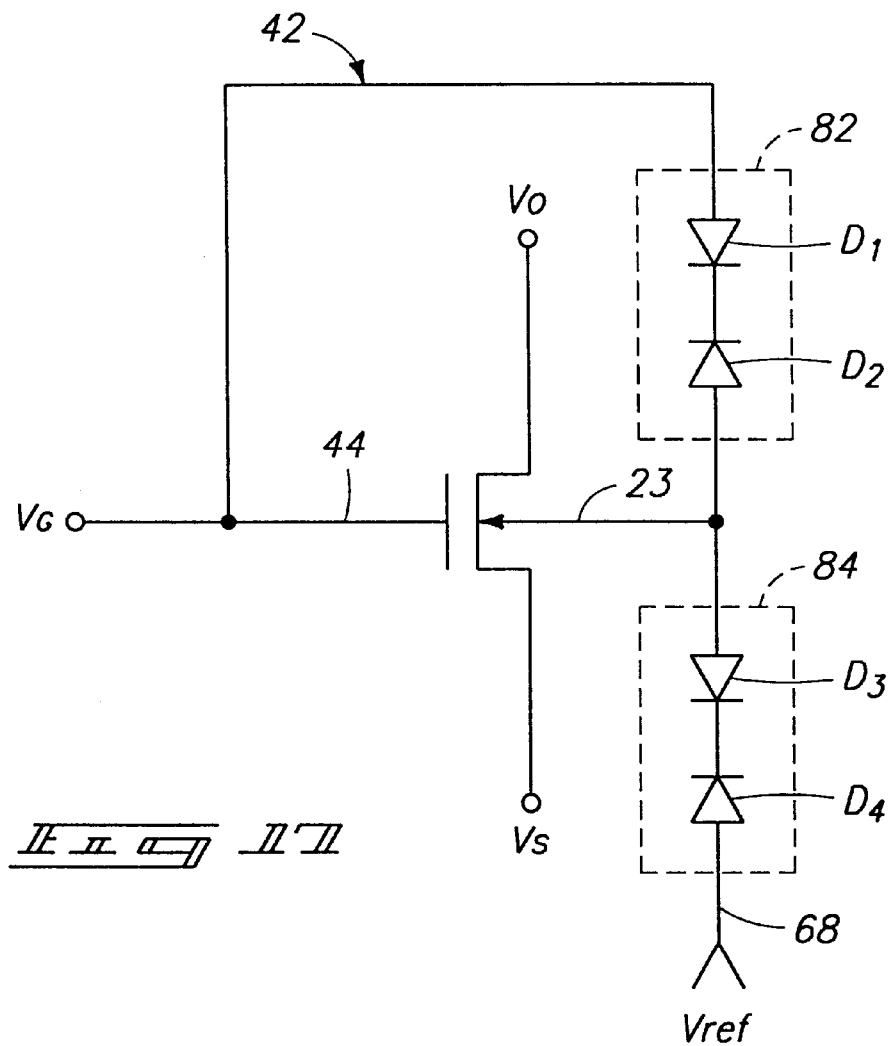
FIG. 11 is a view of the FIG. 9 wafer fragment at a processing step which is subsequent to that shown in FIG. 9.

Referring to FIGS. 11 and 12, conductive layer 38 is etched to provide a conductive line 42 which is in electrical communication with buried contact diffusion region 36 (FIG. 12). Conductive line 42 includes a portion 44 which provides a gate for a field effect transistor which is to be formed.

Figure 13:
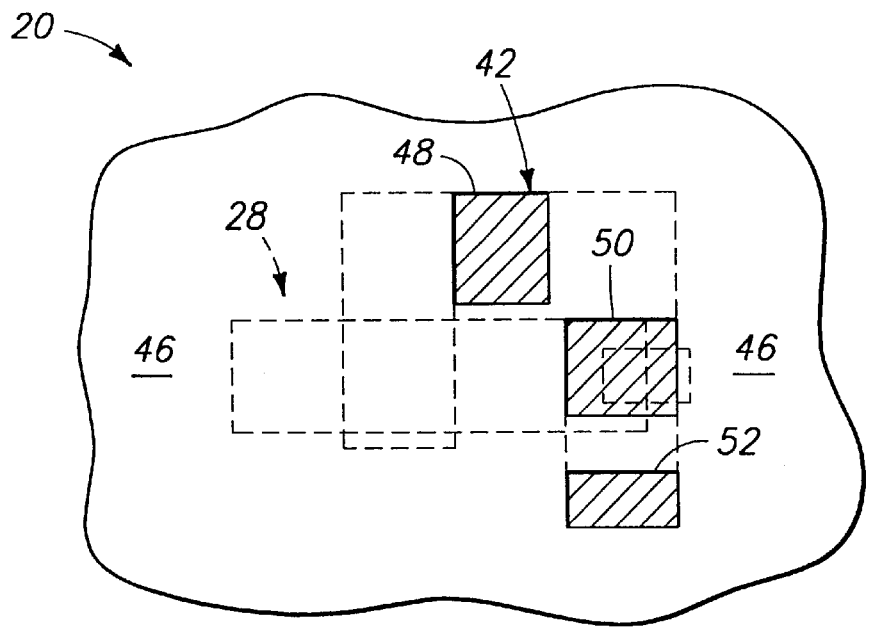
FIG. 13 is a view of the FIG. 11 wafer fragment at a processing step subsequent to that shown in FIG. 11.

Referring to FIG. 13, a patterned masking layer 46 is formed over substrate 22 and includes masking openings 48, 50 and 52 over selected portions of conductive line 42. Exposed conductive line portions are first doped with a first-type dopant which, in the preferred embodiment, comprises p-type dopant. In one embodiment, CMOS circuitry can be contemporaneously formed with the present field effect transistor. In this case, the p-type doping of the conductive line portions can also dope other portions of the wafer where, for example, p-channel devices are being formed. The p-type regions formed within conductive line 42 are spaced-apart along and within the line. Layer 46 is subsequently removed.

In this example, the material comprising conductive line 42 is in situ n-type doped polysilicon. Accordingly, the doping of the selected portions of conductive line 42 just described provides alternating regions of p-type dopant and n-type dopant within conductive line 42. Accordingly, a plurality of pn junctions 66 (FIG. 16) are distributed throughout conductive line 42. In the event that the material comprising conductive line 42 is not in situ doped n-type polysilicon, or in the event conductive line 42 is desired to be rendered even more n-type, it can be further doped with n-type impurity described just below.

Figure 14:
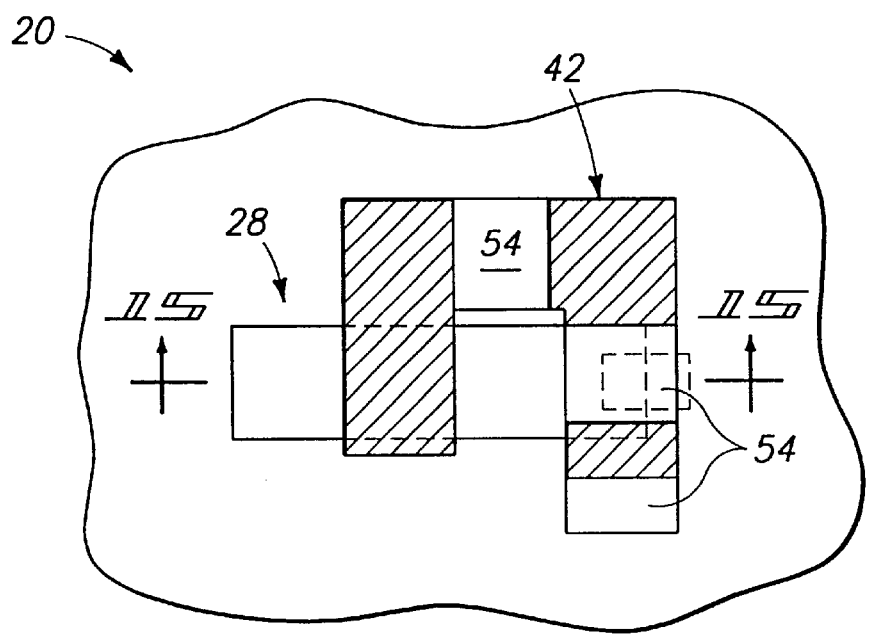
FIG. 14 is a view of the FIG. 13 wafer fragment at a processing step subsequent to that shown in FIG. 13.
Figure 15:
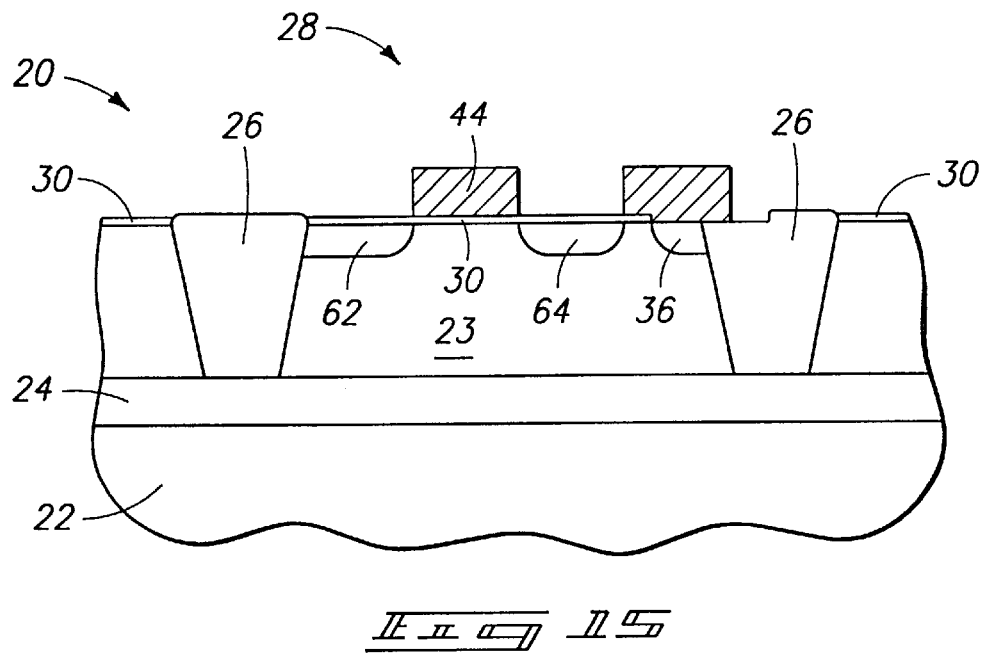
FIG. 15 is a view which is taken along line 15—15 in FIG. 14.

Referring to FIG. 14, a patterned masking layer 54 is formed over substrate 22 and has masking openings over the illustrated cross-hatched portions of conductive line 42 and other transistor structures which define substrate areas within which source/drain regions are to be formed. Exposed conductive line portions are second doped with a second-type dopant which is different from the first-type dopant. Preferably, the second-type dopant is n-type dopant. Doping also occurs sufficiently to form source drain regions 62, 64 (FIG. 15) within substrate 22. Desired spacing between diffusion regions 64 and 36, and the dopant concentration of region 23 therebetween, can combine to avoid Zener diode action.

The doping of the selected portions of conductive line 42 just described provides alternating regions of p-type dopant and n-type dopant within conductive line 42. Accordingly, the dopings define a plurality of pn junctions 66 (FIG. 16) which are distributed throughout conductive line 42.

In one embodiment, that portion of conductive line 42 comprising the gate line of the transistor can subjected to silicide processing. In this embodiment, spacers can be provided over the line, and a protective layer such as an oxide formed through decomposition of TEOS can be formed over the substrate and subsequently patterned to overlie regions 72–80. The protective layer can also overlie other portions of the substrate which are not to be subjected to silicide processing. A refractory metal such as titanium can be formed over the subject polysilicon, and subsequently heat processed to form a silicide layer over the substrate. The silicide can also be formed over the source/drain regions depending upon design considerations.

Figure 16:
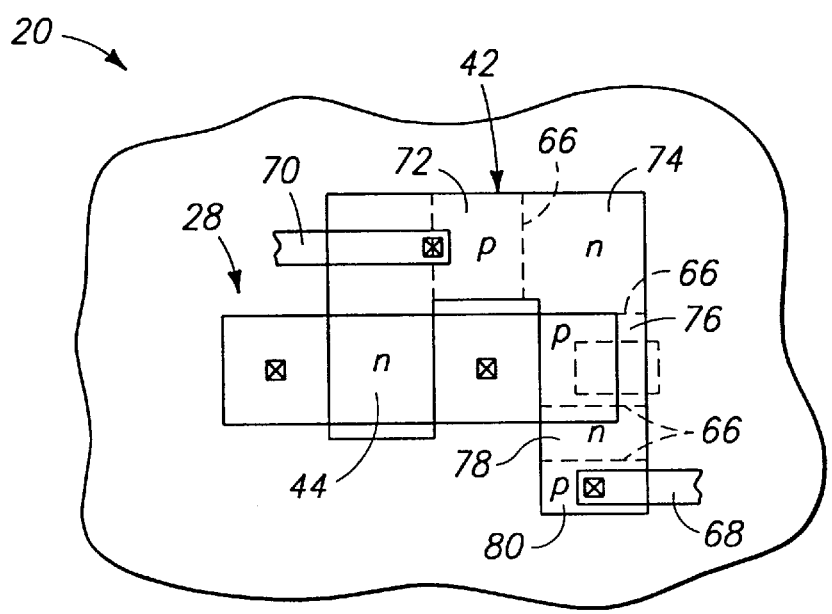
FIG. 16 is a view of the FIG. 14 wafer fragment at a processing step subsequent to that shown in FIG. 14.

Referring to FIG. 16, two nodes 68, 70 are provided. The nodes are provided by forming openings (designated at "x") through an insulative material (not shown), and subsequently filling the openings with conductive material. Metal lines are provided over the insulative material and comprise node portions which are designated with the lead lines of designators 68, 70 respectively. Node 68 provides a reference voltage node which extends to a reference voltage. Node 70 provides a gate voltage node.

Referring to FIGS. 16 and 17, a plurality of regions 72, 74, 76, 78 and 80 are formed within conductive line 42 and are arranged to provide a voltage divider circuit which is connected between gate 44, body 23, and reference voltage node 68. The voltage divider circuit is preferably configured to selectively change threshold voltages of the field effect transistor with state changes in the gate voltage as will become apparent below.

In one embodiment, regions 72–80 are arranged to provide first and second resistive elements received by, supported by, or preferably positioned over the substrate and suitably connected to provide the voltage divider circuit. In this example, a first resistive element includes regions 72, 74 and 76 (a first p-n-p structure), and a second resistive element includes regions 76, 78 and 80 (a second p-n-p structure).

In another embodiment, the plurality of regions 72–80 are arranged within conductive line 42 to provide first and second diode assemblies 82, 84 (FIG. 17). The diode assemblies are received by, supported by, or preferably positioned over the substrate, with the first diode assembly 82 connected between gate 44 and body 23, and second diode assembly 84 connected between body 23 and reference voltage node 68.

In a preferred embodiment, first diode assembly 82 comprises a pair of diodes $D_1$, $D_2$. Each diode has an anode and a cathode, with the cathodes being connected together in a cathode-connected configuration as shown. The anode of diode $D_1$ is connected with gate 44 while the anode of diode $D_2$ is connected with body 23. Diode assembly 84 preferably comprises a pair of diodes $D_3$, $D_4$, each diode having an anode and a cathode with the cathodes being connected together in a cathode-connected configuration as shown. The anode of diode $D_3$ is connected to body 23, and the anode of $D_4$ is connected to reference voltage node 68.

In operation, the field effect transistor of the present invention provides monolithic transistor construction with a bi-level threshold voltage which increases the ratio of $I_{on}$ to $I_{off}$. The transistor's gate is operably connected with the substrate and is configured to change the potential of the substrate. Accordingly, the transistor is selectively configurable by the substrate potential to have different threshold voltages. As an example, with the drain current being in the pico ampere range, when the gate voltage $V_G$ is high (e.g. 3.3 volts), the bulk or body is at 0 volts and the threshold voltage is adjusted by the enhancement implant to be between 0.5 volts to 0 volts. This is desirable for an aggressive $I_{DS}$ conduction. When the gate voltage $V_G$ is low (e.g. 0 volts), the bulk or body is at −1.5 volts and the threshold voltage moves up to 1.0 volts according to the doping profile in the bulk of the n-channel device. In this example, the reference voltage $V_{ref}$ is −3.0 volts. The gate voltage can be less than 0 volts depending on the gate-induced drain leakage of the device as well.

Field-effect transistors constructed in accordance with the invention can have enhanced speed performance which justifies any increase in circuit layout. Other advantages of the invention can include a fairly simplified process flow which enhances the manufacturability of the device. The field effect transistor can have improved drive, as well as an improved on/off current ratio. Accordingly, faster devices can be implemented in current CMOS technologies without sacrificing sub-threshold and/or stand-by current.

While the inventive methods and structures have been described in the context of n-channel devices, it is to be understood that the inventive methods and structures can be equally well-suited for application with p-channel devices, with consideration being given for the inherent differences between n- and p-channel devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field effect transistor comprising:
    providing a semiconductive substrate;
    forming a field effect transistor having a body within the substrate, the transistor having a gate;
    isolating the body from other portions of the substrate; and
    forming a voltage divider circuit over the substrate and connected with the gate, the body, and a reference voltage node, the circuit being configured to selectively change threshold voltages of the field effect transistor when a gate voltage of the field effect transistor changes from high to low, and vice versa.

2. The method of forming a field effect transistor of claim 1, wherein the forming of the voltage divider circuit comprises:
    forming a conductive line, at least a portion of the conductive line providing the gate for the transistor, the conductive line extending to the voltage reference node; and
    doping selected portions of the conductive line to form first and second resistive elements.

3. The method of forming a field effect transistor of claim 1, wherein the forming of the voltage divider circuit comprises:
    forming a conductive layer of material over the substrate;
    etching the conductive layer of material to provide a conductive line, at least a portion of the conductive line providing the gate for the transistor, the conductive line extending to the voltage reference node;
    first doping a first-type of dopant into the conductive line; and
    second doping a second-type of dopant into the conductive line, the first and second dopings providing a plurality of p-type and n-type regions within the conductive line.

4. The method of claim 3, wherein:
    first doping comprises forming p-type regions in the conductive line; and
    second doping comprises forming n-type regions in the conductive line.

5. The method of forming a field effect transistor of claim 1, wherein the forming of the voltage divider circuit comprises:
    forming a conductive layer of material over the substrate;
    etching the conductive layer of material to provide a conductive line, at least a portion of the conductive line providing the gate for the transistor, the conductive line extending to the voltage reference node;
    first doping a first-type of dopant into the conductive line; and
    second doping a second-type of dopant into the conductive line, the first and second dopings providing a plurality of pn junctions distributed along the line.

6. The method of forming a field effect transistor of claim 1, wherein the forming of the voltage divider circuit comprises:
    forming a conductive layer of material over the substrate;
    etching the conductive layer of material to provide a conductive line, at least a portion of the conductive line providing the gate for the transistor, the conductive line extending to the voltage reference node;
    first doping a first-type of dopant into the conductive line; and
    second doping a second-type of dopant into the conductive line, the first and second dopings providing a plurality of pn junctions distributed along the line, wherein two pn junctions are arranged to define a first pair of diodes, and two other pn junctions are arranged to define a second pair of diodes.

7. The method of forming a field effect transistor of claim 6, wherein the first pair of diodes are arranged in a cathode-connected configuration, and the second pair of diodes are arranged in a cathode-connected configuration.

8. The method of forming a field effect transistor of claim 1, wherein the circuit is further configured to increase a ratio of $I_{DS\ ON}/I_{DS\ OFF}$ by the selective changing of threshold voltage of the field effect transistor when the gate voltage of the field effect transistor changes from high to low, and vice versa.

9. The method of forming a field effect transistor of claim 1 further comprising forming a p+ doped buried contact within the body, wherein the forming of the voltage divider circuit comprises forming a first terminal end connected to the gate; forming a second terminal end connected to the reference voltage node; and forming a node of the voltage divider circuit between the first and second terminal ends connected to the p+ doped buried contact.

10. A method of forming a field effect transistor comprising:

providing a semiconductive substrate;

forming a conductive layer of material over the substrate;

patterning the conductive layer of material into a conductive line a portion of which comprises a gate for a field effect transistor;

doping other portions of the conductive line sufficiently to form first and second resistive elements, the resistive elements being operably connected with the gate and substrate and forming a voltage divider configured to selectively manipulate threshold voltages of the field effect transistor with changes in gate voltage;

prior to forming the conductive layer, introducing dopant through openings in a patterned masking layer to form a p+ doped buried contact in a p-type substrate, wherein:

the forming of the conductive layer comprises forming an in-situ-doped n-type polycrystalline layer;

the patterning of the conductive layer comprises patterning the conductive line over and in electrical communication with the p+ doped buried contact; and the doping of the other portions of the conductive line comprises forming p-type regions.

11. The method of forming a field effect transistor of claim 10, wherein the doping of the other portions of the conductive line comprises forming the first resistive element to comprise a first p-n-p structure, and forming the second resistive element to comprise a second p-n-p structure.

12. The method of forming a field effect transistor of claim 10, wherein the doping of the other portions of the conductive line comprises providing alternating regions of p-type dopant and n-type dopant within the conductive line.

13. The method of forming a field effect transistor of claim 10, wherein the doping of the other portions of the conductive line comprises first doping p-type dopant into the conductive line, and second doping n-type dopant into the conductive line.

14. The method of forming a field effect transistor of claim 10, wherein the forming of the voltage divider comprises forming a first terminal end connected to the gate; forming a second terminal end connected to a reference voltage; and forming one of the p-type regions between the first and second terminal ends connected to the p+ doped buried contact.

15. A method of forming a field effect transistor comprising:

forming a conductive line over a semiconductive substrate, a portion of the line forming a gate for a field effect transistor, another portion of the line electrically connecting with the substrate;

doping the conductive line with a first-type dopant;

doping the conductive line with a second-type dopant which is different from the first-type dopant, the dopings defining a plurality of pn junctions distributed throughout the conductive line between the gate and a reference node and configured to selectively manipulate the threshold voltage of the transistor with changes in a gate voltage of the transistor; and prior to forming the conductive line, introducing dopant through openings in a patterned masking layer to form a p+ doped buried contact in a p-type substrate, wherein the forming of the conductive line comprises forming the conductive line to be in electrical communication with the p+ doped buried contact.

16. The method of forming a field effect transistor of claim 15, wherein the doping of the conductive line with the first-type dopant comprises forming spaced-apart regions comprising the first-type dopant along and within the conductive line.

17. The method of forming a field effect transistor of claim 15, wherein the doping of the conductive line with the second-type dopant comprises forming spaced-apart regions comprising the second-type dopant within the conductive line.

18. The method of forming a field effect transistor of claim 15, wherein the first-type dopant comprises p-type dopant and the second-type dopant comprises n-type dopant.

19. The method of forming a field effect transistor of claim 15, wherein:

the dopings define a plurality of pn junctions arranged to provide first and second diode assemblies;

the first diode assembly comprising a pair of cathode-connected diodes;

the second diode assembly comprising a pair of cathode-connected diodes; and the first and second diode assemblies being operably connected in a voltage divider configuration across the substrate and being configured to selectively manipulate the threshold voltage of the transistor with changes in the gate voltage of the transistor.

20. The method of forming a field effect transistor of claim 15, wherein the dopings comprise forming a first terminal end connected to the gate; forming a second terminal end connected to the reference node; and forming a node between the first and second terminal ends connected to the p+ doped buried contact.

21. A method of forming integrated circuitry comprising:

providing a semiconductive substrate;

forming a first patterned masking layer over the substrate;

doping into the substrate through the first patterned masking layer to form a buried contact;

removing the first patterned masking layer;

forming a conductive layer of material over the substrate and in electrical communication with the buried contact;

patterning the conductive layer into a conductive line in electrical communication with the buried contact, a portion of the conductive line providing a field effect transistor gate;

forming another patterned masking layer over the substrate and having masking openings over selected portions of the conductive line;

first doping into the selected portions of the conductive line with a first-type dopant;

removing the another patterned masking layer;

forming a different patterned masking layer over the substrate and having openings over different selected portions of the conductive line;

second doping into the different selected portions of the conductive line with a second-type dopant which is different from the first-type dopant, the first and second dopings defining a plurality of pn junctions distributed throughout the conductive line between the gate and a reference node; and wherein the doping into the substrate comprises introducing dopant through openings in the first patterned masking layer to form a p+ doped buried contact in a p-type substrate, and wherein the patterning the conductive layer into the conductive line comprises patterning the conductive layer into a conductive line formed to be in electrical communication with the p+ doped buried contact.

22. The method of claim 21, wherein the first and second dopings defining the plurality of pn junctions comprises forming a first terminal end connected to the gate; forming a second terminal end connected to the reference node; and forming a p-type node between the first and second terminal ends connected to the p+ doped buried contact.

23. A method of forming integrated circuitry comprising:

providing a semiconductive substrate;

forming a first patterned masking layer over the substrate;

doping into the substrate through the first patterned masking layer to form a buried contact;

removing the first patterned masking layer;

forming a conductive layer of material over the substrate and in electrical communication with the buried contact;

patterning the conductive layer into a conductive line in electrical communication with the buried contact, a portion of the conductive line providing a field effect transistor gate;

forming another patterned masking layer over the substrate and having masking openings over selected portions of the conductive line;

first doping into the selected portions of the conductive line with a first-type dopant;

removing the another patterned masking layer;

forming a different patterned masking layer over the substrate and having openings over different selected portions of the conductive line;

second doping into the different selected portions of the conductive line with a second-type dopant which is different from the first-type dopant, the first and second dopings providing a plurality of pn junctions distributed along the line, wherein two pn junctions are arranged to define a first pair of diodes, and two other pn junctions are arranged to define a second pair of diodes, the first pair of diodes being arranged in a cathode-connected configuration, and the second pair of diodes being arranged in a cathode-connected configuration; and wherein the doping into the substrate comprises introducing dopant through openings in the first patterned masking layer to form a p+ doped buried contact in a p-type substrate, the conductive line being formed to be in electrical communication with the p+ doped buried contact.

24. The method of claim 23, wherein the first pair of diodes comprises forming a first anode connected to the field effect transistor gate and forming a second anode connected to the p+ doped buried contact, and wherein the second pair of diodes comprises forming a first anode connected to the p+ doped buried contact and forming a second anode connected to a reference voltage node.

25. A method of forming a field effect transistor comprising:

providing a semiconductive substrate;

forming a field effect transistor having a body within the substrate, the transistor having a gate;

forming a voltage divider circuit over the substrate and connected with the gate, the body, and a reference voltage node, the voltage divider circuit being configured to selectively change threshold voltages of the field effect transistor when a gate voltage of the field effect transistor changes from high to low, and vice versa, forming the voltage divider circuit comprising:

forming a conductive layer of material over the substrate;

etching the conductive layer of material to provide a conductive line, at least a portion of the conductive line providing the gate for the transistor, the conductive line extending to the voltage reference node; and doping selected portions of the conductive line to form first and second resistive elements; and forming a buried mega eV layer within the substrate to at least partially isolate the body.

26. The method of claim 25, wherein doping comprises:

first doping a first-type of dopant into first portions of the conductive line; and second doping a second-type of dopant into second portions of the conductive line, first and second doping comprising providing a plurality of p-type and n-type regions within the conductive line.

27. The method of claim 25, wherein forming the voltage divider circuit comprises:

first doping a first-type of dopant into first portions of the conductive line; and second doping a second-type of dopant into second portions of the conductive line, first and second doping comprising providing a plurality of pn junctions distributed along the line.

28. The method of claim 25, wherein:

first doping comprises forming p-type regions in first portions of the conductive line; and second doping comprises forming n-type regions in second portions of the conductive line.

29. The method of claim 25, wherein:

first doping comprises forming p-type regions in the conductive line;

second doping comprises forming n-type regions in the conductive line; and further comprising:

doping into the substrate to form a p+ doped buried contact in a p-type substrate prior to forming the voltage divider.

30. The method of claim 29, wherein doping into the substrate comprises doping into the substrate through an opening in a patterned masking layer to form a p+ doped buried contact in a p-type substrate prior to forming the voltage divider.

31. The method of claim 25, wherein the forming of the voltage divider circuit comprises forming a first terminal end connected to the gate of the transistor; forming a second terminal end connected to the reference voltage node; and forming a node of the voltage divider circuit between the first and second terminal ends connected to the body of the transistor.

32. A method of forming a field effect transistor comprising:

providing a silicon-on-insulator substrate;

forming a field effect transistor having a p-type body within the substrate, the transistor having a gate, the p-type body including a p+ contact thereto;

forming a voltage divider circuit over the substrate and connected with the gate, the p-type body, and a reference voltage node, forming the voltage divider circuit comprising:

forming a first diode having a first anode coupled to the gate and a first cathode;

forming a second diode having a second cathode coupled to the first cathode and a second anode coupled to the p+ contact;

forming a third diode having a third anode coupled to the p+ contact and a third cathode; and forming a fourth diode having a fourth anode coupled to the reference voltage node and a fourth cathode coupled to the third cathode, the voltage divider circuit being configured to selectively change a threshold voltage of the field effect transistor when a gate voltage of the field effect transistor changes from high to low, and vice versa.

33. The method of claim 32, wherein forming the voltage divider circuit comprises forming the voltage divider circuit to be configured to change the threshold voltage from between one-half of a volt and zero volts when a gate voltage of the field effect transistor is high to another threshold voltage of about one volt when the gate voltage is low.

34. The method of claim 32, wherein forming the first, second, third and fourth diodes comprises:

forming a layer of polysilicon over the substrate;

forming a conductive line from the conductive layer of polysilicon, a portion of the conductive line comprising the gate;

doping selected portions of the conductive line with n-type dopant to form the first, second, third and fourth cathodes; and doping other selected portions of the conductive line with p-type dopant to form the first, second, third and fourth anodes.

35. The method of claim 32, wherein forming a field effect transistor comprises doping into the semiconductor substrate through a patterned masking layer to form a p+ doped buried contact in a p-type substrate prior to forming the voltage divider circuit.

36. The method of claim 32, wherein forming the voltage divider circuit comprises forming the voltage divider circuit to be configured to change a voltage of the body from about zero volts when the gate voltage is high, to about minus one point five volts when the gate voltage is low.

37. The method of claim 32, wherein forming the voltage divider circuit comprises forming the voltage divider circuit to be configured to change the threshold voltage from between one-half volt and zero volts and to change the voltage of the body from at about zero volts when a gate voltage of the field effect transistor is high, to a new threshold voltage of about one volt and a new voltage of the body of about minus one point five volts when the gate voltage is low.

38. A method of forming a field effect transistor comprising:

providing a semiconductive substrate;

forming a field effect transistor having a body within the substrate, the transistor having a gate;

forming isolation regions and a buried mega eV layer within the substrate to collectively isolate the body; and forming a resistive voltage divider circuit over the substrate and coupled to the gate, the body, and a reference voltage node, the circuit being configured to increase a ratio of $I_{DS\ ON}/I_{DS\ OFF}$ by selectively changing threshold voltages of the field effect transistor when a gate voltage of the field effect transistor changes from high to low, and vice versa.

39. The method of forming a field effect transistor of claim 38, wherein the forming of the voltage divider circuit comprises:

forming a conductive line, at least a portion of the conductive line providing the gate for the transistor, the conductive line extending to the voltage reference node; and doping selected portions of the conductive line to form first and second resistive elements.

40. The method of forming a field effect transistor of claim 38, wherein the forming of the voltage divider circuit comprises:

forming a conductive layer of material over the substrate;

etching the conductive layer of material to provide a conductive line, at least a portion of the conductive line providing the gate for the transistor, the conductive line extending to the voltage reference node;

first doping a first-type of dopant into the conductive line; and second doping a second-type of dopant into the conductive line, the first and second dopings providing a plurality of p-type and n-type regions within the conductive line.

41. The method of forming a field effect transistor of claim 38, wherein the forming of the voltage divider circuit comprises:

forming a conductive layer of material over the substrate;

etching the conductive layer of material to provide a conductive line, at least a portion of the conductive line providing the gate for the transistor, the conductive line extending to the voltage reference node;

first doping a first-type of dopant into the conductive line; and second doping a second-type of dopant into the conductive line, the first and second dopings providing a plurality of pn junctions distributed along the line.

42. The method of forming a field effect transistor of claim 38, wherein the forming of the voltage divider circuit comprises:

forming a conductive layer of material over the substrate;

etching the conductive layer of material to provide a conductive line, at least a portion of the conductive line providing the gate for the transistor, the conductive line extending to the voltage reference node;

first doping a first-type of dopant into the conductive line; and second doping a second-type of dopant into the conductive line, the first and second dopings providing a plurality of pn junctions distributed along the line, wherein two pn junctions are arranged to define a first pair of diodes, and two other pn junctions are arranged to define a second pair of diodes.

43. The method of forming a field effect transistor of claim 42, wherein the first pair of diodes are arranged in a cathode-connected configuration, and the second pair of diodes are arranged in a cathode-connected configuration.

44. The method of claim 38, wherein the forming of the resistive voltage divider circuit comprises forming a first terminal end connected to the gate of the transistor; forming a second terminal end connected to the reference voltage node; and forming a node of the resistive voltage divider circuit between the first and second terminal ends connected to the body of the transistor.

* * * * *